(12) United States Patent
Domanski

(10) Patent No.: US 9,324,845 B2
(45) Date of Patent: Apr. 26, 2016

(54) ESD PROTECTION STRUCTURE, INTEGRATED CIRCUIT AND SEMICONDUCTOR DEVICE

(71) Applicant: Infineon Technologies AG, Neubiberg (DE)

(72) Inventor: Krzysztof Domanski, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 118 days.

(21) Appl. No.: 13/711,588

(22) Filed: Dec. 11, 2012

(65) Prior Publication Data

US 2014/0159207 A1    Jun. 12, 2014

(51) Int. Cl.
*H01L 29/73* (2006.01)
*H01L 29/735* (2006.01)
*H01L 27/02* (2006.01)

(52) U.S. Cl.
CPC ............ *H01L 29/73* (2013.01); *H01L 27/0259* (2013.01); *H01L 29/735* (2013.01)

(58) Field of Classification Search
CPC ..... H01L 29/72; H01L 29/74; H01L 29/0821; H01L 29/7322
USPC .................. 257/565, 579, 355, 356, 360, 557
See application file for complete search history.

(56) References Cited

U.S. PATENT DOCUMENTS

| | | | |
|---|---|---|---|
| 5,852,315 A | 12/1998 | Ker et al. | |
| 6,888,201 B2 | 5/2005 | Yu | |
| 7,005,708 B2 * | 2/2006 | Mergens et al. | 257/360 |
| 7,439,608 B2 * | 10/2008 | Arendt | 257/592 |
| 7,642,621 B2 | 1/2010 | Takahashi | |
| 7,800,128 B2 | 9/2010 | Domanski et al. | |
| 7,851,872 B2 | 12/2010 | Sutardja | |
| 8,896,064 B2 | 11/2014 | Hwang | |

(Continued)

FOREIGN PATENT DOCUMENTS

CN    1310325 C    4/2007
CN    101106128 A    1/2008

(Continued)

OTHER PUBLICATIONS

Pogany et al. "Moving Current Filaments in ESD Protection Devices and Their Relation to Electrical Characteristics", Reliability Physics Symposium Proceedings, 2003. 41st Annual. 2003 IEEE International, Inst. for Solid State Electron., Tech. Univ. of Vienna, Austria, Mar. 30-Apr. 4, 2003, pp. 241-248.

(Continued)

*Primary Examiner* — Matthew W Such
*Assistant Examiner* — Warren H Kilpatrick

(57) ABSTRACT

Implementations are presented herein that include an ESD protection structure. The structure may include a plurality of first doped regions forming first terminals of a plurality of transistors, a plurality of second doped regions forming second terminals of the plurality of transistors, and a third doped region surrounding the plurality of first doped regions and the plurality of second doped regions to form a common third terminal of the plurality of transistors. The plurality of first doped regions and the plurality of second doped regions may be arranged in an alternating pattern such that an ESD discharge current received on any one of the plurality of first doped regions dissipates through at least two of the plurality of second doped regions.

22 Claims, 2 Drawing Sheets

(56) References Cited

U.S. PATENT DOCUMENTS

| | | |
|---|---|---|
| 2002/0003236 A1 | 1/2002 | Czech et al. |
| 2008/0013234 A1 | 1/2008 | Takahashi |
| 2008/0137244 A1 | 6/2008 | Yo et al. |
| 2010/0032714 A1* | 2/2010 | Takahashi .................... 257/173 |
| 2010/0301453 A1 | 12/2010 | Chung et al. |
| 2012/0092798 A1 | 4/2012 | Hwang |
| 2012/0168906 A1 | 7/2012 | Kuo et al. |

FOREIGN PATENT DOCUMENTS

| | | |
|---|---|---|
| CN | 102456686 A | 5/2012 |
| WO | 03/005523 A2 | 1/2003 |

OTHER PUBLICATIONS

Litzenberger et al., "Scanning Heterodyne Interferometer Setup for the Time-Resolved Thermal and Free-Carrier Mapping in Semiconductor Devices", IEEE Transactions on Instrumentation and Measurement, vol. 54, No. 6, Dec. 2005, pp. 2438-2445.

* cited by examiner

A-A'

US 9,324,845 B2

ESD PROTECTION STRUCTURE, INTEGRATED CIRCUIT AND SEMICONDUCTOR DEVICE

BACKGROUND

Electrostatic discharge (ESD) protection design is a major factor with respect to the reliability of integrated circuits. Generally, ESD is the transfer of an electrostatic charge between bodies at different electrostatic potentials or voltages, caused by direct contact or induced by an electrostatic field. The device size and the thickness of the oxide and of the insulating layers of transistors of integrated circuits are being continually reduced to improve the operating speed of the transistors and integration density of the integrated circuits. These highly scaled-down devices, however, have been found to be increasingly vulnerable to ESD. Therefore, ESD protection circuits have been added to the integrated circuits to protect the integrated circuits against ESD damage. ESD protection circuits may be implemented around the input, output and supply pads of the integrated circuits to bypass ESD current away from the internal devices of the integrated circuits.

BRIEF DESCRIPTION OF THE DRAWINGS

The detailed description is described with reference to the accompanying figures. In the figures, the left-most digit of a reference number identifies the figure in which the reference number first appears. The use of similar reference numbers in different instances in the description and the figures may indicate similar or identical items. The accompanying figures show schematic illustrations and are not drawn to scale.

SUMMARY

Figure 1:
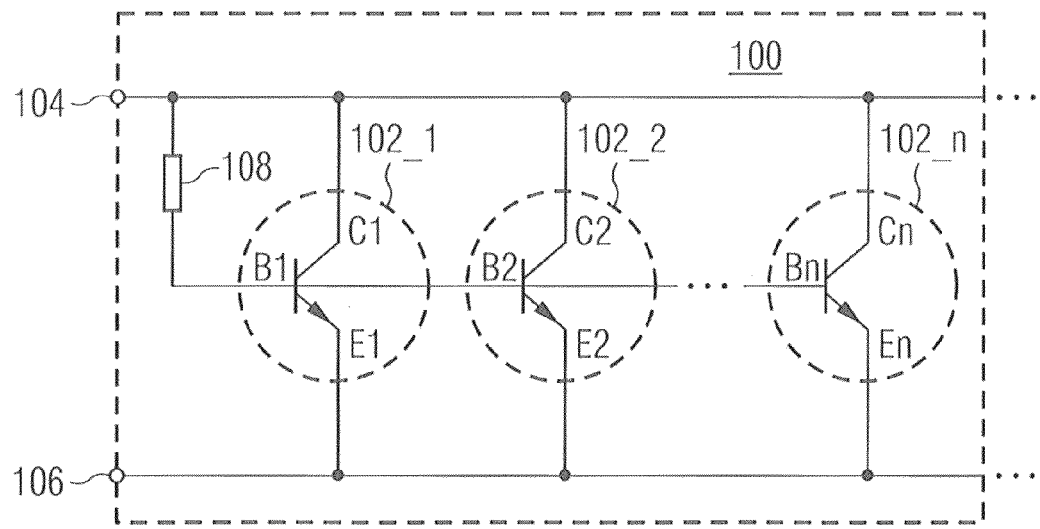
FIG. 1 shows a schematic circuit diagram of an exemplary ESD protection structure that includes a plurality of transistors.

This disclosure is directed to integrated circuits, devices, structures, and methods that provide for improved protection against electrostatic discharge (ESD). According to one example, an integrated circuit includes an ESD protection structure formed in a substrate. The ESD protection structure includes a plurality of first doped regions, a plurality of second doped regions and at least one third doped region surrounding the plurality of first doped regions and the plurality of second doped regions. The plurality of first doped regions and the plurality of second doped regions are of a first conductivity type and the third doped region is of a second conductivity type. The second conductivity type is opposite the first conductivity type. The plurality of first doped regions form first terminals (e.g., collector terminals) of a plurality of transistors and the plurality of second doped regions form second terminals (e.g., emitter terminals) of the plurality of transistors. The first doped regions and the second doped regions are arranged in an alternating pattern. For example, each of the plurality of first doped regions may be arranged adjacent to one of the plurality of second doped regions in an alternating pattern in a first dimension. In some examples, each of the plurality of first doped regions is further arranged adjacent to one of the plurality of second doped regions in an alternating pattern in a second dimension different than the first dimension.

According to the techniques described herein, an ESD discharge current received at any one of the plurality of first doped regions will dissipate through at least two of the plurality of second doped regions. Therefore, the ESD discharge current may distribute uniformly among the plurality of transistors of the ESD protection structure formed by the alternating plurality of first doped regions and plurality of second doped regions. As such, the ESD protection structure itself may be efficiently protected against damage during an ESD stress event. Further, the plurality of transistors of the ESD protection structure may trigger homogenously and may switch on uniformly. The ESD protection structure may provide efficient protection from ESD damage for a circuit or device that is coupled to the ESD protection structure.

According to one example, this disclosure describes an ESD protection structure. The ESD protection structure includes a plurality of first doped regions of a first conductivity formed in a substrate. The plurality of first doped regions form first terminals of a plurality of transistors. The ESD protection structure further includes a plurality of second doped regions of a second conductivity type different than the first conductivity type formed in the substrate. The plurality of second doped regions form second terminals of a plurality of transistors. Each of the plurality of first doped regions is arranged adjacent to one of the plurality of second doped regions in an alternating pattern in a first dimension, and each of the plurality of first doped regions is further arranged adjacent to one of the plurality of second doped regions in an alternating pattern in a second dimension different than the first dimension. The ESD protection structure further includes a third doped region of a second conductivity type opposite the first conductivity type formed in the substrate. The third doped region surrounds the plurality of first doped regions and the plurality of second doped regions to form a common third terminal of the plurality of transistors.

According to another example, this disclosure describes an integrated circuit. The integrated circuit includes a plurality of bipolar junction transistors (BJTs). Each of the plurality of BJTs includes a collector region and an emitter region. The plurality of collector regions and the plurality of emitter regions are arranged in an array of rows and columns. The plurality of collector regions and the plurality of emitter regions are arranged in an alternating pattern within each row of the array and the plurality of collector regions and the plurality of emitter regions are arranged in an alternating pattern within each column of the array. The plurality of BJTs further include a common base region. The common base region surrounds the plurality of collector regions and the plurality of emitter regions and the common base region forms a common base terminal of the plurality of BJTs.

According to another example, this disclosure describes a semiconductor device. The semiconductor device includes a plurality of first doped regions and a plurality of second doped regions. The plurality of first doped regions form first terminals of a plurality of transistors and the plurality of second doped regions form second terminals of the plurality of transistors. The semiconductor device further includes a third doped region that surrounds the plurality of first doped regions and the plurality of second doped regions. The third doped region forms a common third terminal of the plurality of transistors. The plurality of first doped regions and the plurality of second doped regions are arranged in an alternating pattern such that an ESD discharge current received on any one of the plurality of first doped regions dissipates through at least two of the plurality of second doped regions.

The techniques described herein may be implemented in a number of ways. Examples and context are provided below with reference to the included figures and ongoing discussion.

DETAILED DESCRIPTION

FIG. 1 shows a schematic circuit diagram of an exemplary ESD protection structure 100 that includes a plurality of transistors 102_1, 102_2, . . . 102_n. The plurality of transistors 102_1, 102_2, . . . 102_n are all of the same type. In the embodiment as illustrated and described in connection with FIG. 1, the plurality of transistors 102_1, 102_2, . . . 102_n are bipolar junction transistors (BJTs) of npn-type. The plurality of npn-transistors 102_1, 102_2, . . . 102_n are coupled in parallel, i. e., a collector-terminal C1 of a first transistor 102_1, a collector-terminal C2 of a second transistor 102_2 and a collector-terminal Cn of an nth transistor 102_n are coupled to each other. Besides, an emitter-terminal E1 of the first transistor 102_1, an emitter-terminal E2 of the second transistor 102_2 and an emitter-terminal En of the nth transistor 102_n are coupled to each other. Furthermore, a base-terminal B1 of the first transistors 102_1, a base-terminal B2 of the second transistor 102_2 and a base-terminal Bn of the nth transistor 102_n are coupled to each other.

The plurality of collector-terminals C1, C2, . . . Cn are coupled to each other to form a first terminal 104 of the ESD protection structure 100. In other words, the plurality of collector-terminals C1, C2, . . . Cn are coupled to each other to form a common first terminal 104. The plurality of emitter-terminals E1, E2, . . . En are coupled to each other to form a second terminal 106 of the ESD protection structure 100. In other words, the plurality of emitter-terminals E1, E2, . . . En are coupled to each other to form a common second terminal 106. The plurality of base-terminals B1, B2, . . . Bn are coupled to the first terminal 104 via a transfer structure 108. In some embodiments, the transfer structure 108 may include a resistor or a part of a line. In another embodiment, the transfer structure 108 may include an RC-circuit that is connected ahead of a transistor.

The first terminal 104 may be coupled to one of a supply voltage, a ground voltage and an input/output- (I/O-) signal. Likewise, the second terminal 106 may be coupled to one of a supply voltage, a ground voltage and an I/O-signal. In one embodiment, the first terminal 104 and/or the second terminal 106 may be coupled to a pad. An ESD stress event may occur on at least one of the first terminal 104 and the second terminal 106. The plurality of transistors 102_1, 102_2, . . . 102_n of the ESD protection structure 100 may dissipate the ESD event received on at least one of the first terminal 104 and the second terminal 106.

The ESD protection structure 100 may not perform any logic operation. The purpose of the ESD protection structure 100 may be dedicated to the dissipation of ESD stress events received on one of its terminals 104 and 106. The ESD protection structure 100 may be coupled to further circuits or devices as indicated by dotted lines in FIG. 1. The further circuits or devices may include a further ESD protection structure and/or a circuit to be protected. The circuit to be protected may be susceptible to damage due to an ESD event and the ESD protection structure 100 may protect the circuit to be protected from ESD damage.

Figure 2:
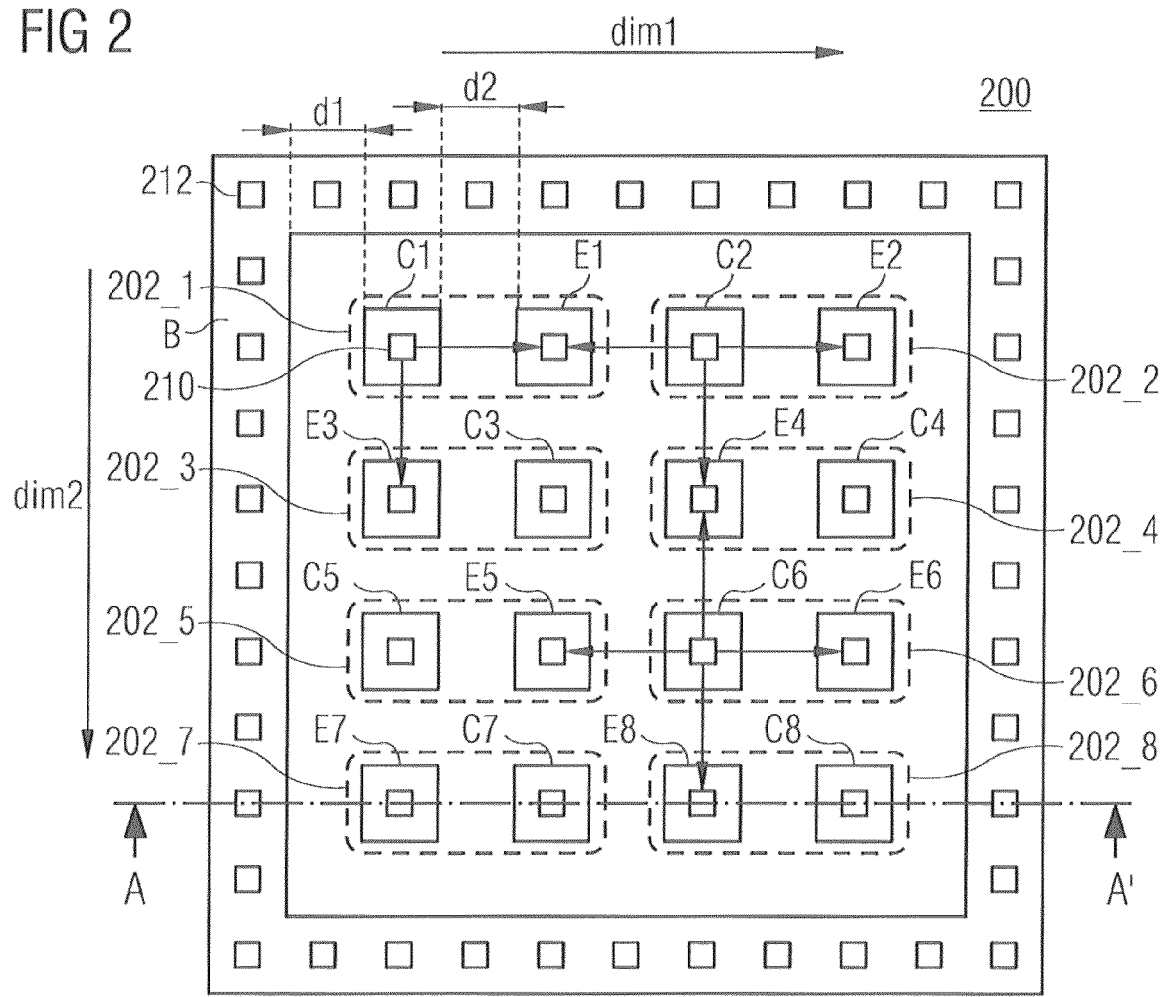
FIG. 2 shows a schematic layout view of a further exemplary ESD protection structure.

FIG. 2 shows a schematic layout view of a further exemplary ESD protection structure 200. In one embodiment, the further exemplary ESD protection structure 200 may correspond to the ESD protection structure 100, as illustrated and described in connection with FIG. 1. The exemplary ESD protection structure 200 includes a plurality of transistors 202_1, 202_2, . . . 202_8. A plurality of first doped regions C1, C2, . . . C8 form first terminals of the plurality of transistors 202_1, 202_2, . . . 202_8. A plurality of second doped regions E1, E2, . . . E8 form second terminals of the plurality of transistors 202_1, 202_2, . . . 202_8. A third doped region B forms third terminals of the plurality of transistors 202_1, 202_2, . . . 202_8, i. e., the plurality of transistors 202_1, 202_2, . . . 202_8 have a common third terminal. The third doped region B is a continuous region that surrounds the plurality of first doped regions C1, C2, . . . C8 and the plurality of second doped regions E1, E2, . . . E8. The third doped region B may also be referred to as substrate ring or guard ring.

The third doped region B is disposed adjacent to the plurality of first doped regions C1, C2, . . . C8 and the plurality of second doped regions E1, E2, . . . E8 at a distance d1. The plurality of first doped regions C1, C2, . . . C8 and the plurality of second doped regions E1, E2, . . . E8 among themselves are placed at a distance d2. In FIG. 2, the distance d1 is marked with respect to the third doped region B and the first doped region C1. The distance d2 is marked with respect to the first doped region C1 and the second doped region E1, as an example. The distance d1 may be same or different than the distance d2. At least one of the distances d1 and d2 may correspond with a minimum distance between regions according to a particular technology used. In some embodiments, distances greater than a minimum distance may be used within the ESD protection structure 200. In some embodiments, the distance between the third doped region B and the plurality of first doped regions C1, C2, . . . C8 and the plurality of second doped regions E1, E2, . . . E8 may not be uniform. Likewise, the distance between the plurality of first doped regions C1, C2, . . . C8 and the plurality of second doped regions E1, E2, . . . E8 may not be uniform.

Each of the plurality of first doped regions C1, C2, . . . C8 may include a contact 210 for electrical connection and each of the plurality of second doped regions E1, E2, . . . E8 may include a contact 210 for electrical connection. Furthermore, the third doped region B may include a plurality of contacts 212 for electrical connection. The third doped region may be restricted to be contacted via the plurality of contacts 212. In other words, the third doped region may exclusively be contacted via the contacts 212 that are contained within the third doped region B. That means, no other space within the ESD protection structure 200 needs to be provided to contact the third doped region B. This may allow for an area-efficient implementation of the ESD protection structure 200.

In one embodiment, the plurality of first doped regions C1, C2, . . . C8 may be electrically connected to each other via contacts 210 to form a first terminal of the ESD protection structure 200 and the plurality of second doped regions E1, E2, . . . E8 may be electrically connected to each other via contacts 210 to form a second terminal of the ESD protection structure 200.

In one embodiment, the ESD protection structure 200 may further include a transfer structure (not shown in FIG. 2) that is coupled between the third doped region B and the first terminal of the ESD protection structure 200. In one embodiment, the transfer structure may correspond to the transfer structure 108, as illustrated and described in connection with FIG. 1.

A positive ESD stress may be received on the first terminal of the ESD protection structure 200 and the second terminal of the ESD protection structure 200 may be connected to a ground potential. The ESD stress event may dissipate through the plurality of transistors 202_1, 202_2, . . . 202_8, and an ESD discharge current may flow from the first terminal of the ESD protection structure 200 through the second terminal of the ESD protection structure 200 to the ground potential.

Referring to FIG. 2, during dissipation of the ESD event, part of the ESD current may flow through a first transistor 202_1 of the plurality of transistors 202_1, 202_2, . . . 202_8, i.e., part of the ESD discharge current may flow from a first doped region C1 of a first transistor 202_1 to a second doped region E1 of the first transistor 202_1 (as indicated by an arrow in FIG. 2). In addition, part of the ESD discharge current may flow from the first doped region C1 of the first transistor 202_1 to a second doped region E3 of a third transistor 202_3 of the plurality of transistors 202_1, 202_2, . . . 202_8 (as indicated by an arrow in FIG. 2). That means, an ESD discharge current passing the first doped region C1 of the first transistor 202_1 may split and dissipate through the two second doped regions E1 and E3 that both are placed adjacent to the first doped region C1.

In the example described above, there are two second doped regions E1 and E3 that are placed adjacent to the first doped region C1. In another example, there are more than two second doped regions that are placed adjacent to a first doped region. For example, a first doped region C2 of a second transistor 202_2 of the plurality of transistors 202_1, 202_2, . . . 202_8 is facing the second doped region E1 of the first transistor 202_1, a second doped region E2 of the second transistor 202_2 and a second doped region E4 of a forth transistor 202_4 of the plurality of transistors 202_1, 202_2, . . . 202_8. That means, the first doped region C2 of the second transistor 202_2 is placed adjacent to three second doped regions E1, E2 and E4. In this example, an ESD discharge current or part of an ESD discharge current may divide up and may dissipate from the first doped region C2 through the three second doped regions E1, E2 and E4 (as indicated by arrows in FIG. 2).

In a further example, an ESD discharge current may dissipate from one first doped region through four second doped regions. For example, an ESD discharge current received on a first doped region C6 of a sixth transistor 202_6 of the plurality of transistors 202_1, 202_2, . . . 202_8 may dissipate through the second doped region E4 of the forth transistor 202_4, a second doped region E5 of a fifth transistor 202_5 of the plurality of transistors 202_1, 202_2, . . . 202_8, a second doped region E6 of the sixth transistor 202_6 and a second doped region E8 of an eighth transistor 202_8 of the plurality of transistors 202_1, 202_2, . . . 202_8 (as indicated by arrows in FIG. 2). That means, the ESD current that passes the first doped region C6 may dissipate through the four second doped regions E4, E5, E6 and E8 that are placed all around the first doped region C6.

In the ESD protection structure 200 of FIG. 2, the first doped regions C1, C2, . . . C8 of the plurality of transistors 202_1, 202_2, . . . 202_8 and the second doped regions E1, E2, . . . E8 of the plurality of transistors 202_1, 202_2, . . . 202_8 are arranged in an alternating pattern. Each first doped region C1, C2, . . . C8 of the plurality of transistors 202_1, 202_2, . . . 202_8 is arranged adjacent to a second doped region E1, E2, . . . E8 in an alternating pattern in a first dimension dim1. Each first doped region C1, C2, . . . C8 of the plurality of transistors 202_1, 202_2, . . . 202_8 is further arranged adjacent to a second doped region E1, E2, . . . E8 in an alternating pattern in a second dimension dim2. The second dimension dim2 is different than the first dimension dim1. In one example, the first dimension dim1 comprises a first direction traversing a surface of the ESD protection structure 200 and the second dimension dim2 comprises a second direction different than the first direction traversing the surface of the ESD protection structure 200.

Referring to FIG. 2, by placing the plurality of first doped regions C1, C2, . . . C8 and the plurality of second doped regions E1, E2, . . . E8 in an alternating pattern, an ESD discharge current may distribute uniformly among the plurality of transistors 202_1, 202_2, . . . 202_8 of the ESD protection structure 200. An ESD discharge current received on any one of the plurality of first doped regions C1, C2, . . . C8 will dissipate through at least two of the plurality of second doped regions E1, E2, . . . E8. The occurrence of filaments between one of the plurality of first doped regions C1, C2, . . . C8 and one of the plurality of second doped regions E1, E2, . . . E8 may be suppressed and therefore, the ESD protection structure 200 itself may be protected against damage during an ESD stress event.

Further, the plurality of transistors 202_1, 202_2, . . . 202_8 of the ESD protection structure 200 may trigger homogenously and may switch on uniformly. An ESD event received on the first terminal of the ESD protection structure 200 may dissipate quickly through the plurality of transistors 202_1, 202_2, . . . 202_8 to the second terminal of the ESD protection structure 200 and to the ground potential. Therefore, the ESD protection structure 200 may provide efficient protection from ESD damage for a circuit or device that is coupled to the ESD protection structure 200.

Referring to FIG. 2, the plurality of first doped regions C1, C2, . . . C8 and the plurality of second doped regions E1, E2, . . . E8 are arranged in an array of rows and columns. The array contains four rows and four columns. The array may be referred to as 4×4 array and/or 4×4 grid. Each row contains two first doped regions of the plurality of first doped regions C1, C2, . . . C8 and two second doped regions of the plurality of second doped regions E1, E2, . . . E8. Generally, each row may contain part of the plurality of first doped regions C1, C2, . . . C8 and part of the plurality of second doped regions E1, E2, . . . E8. Within each row, the first doped regions C1, C2, . . . C8 and the second doped regions E1, E2, . . . E8 of the respective row are arranged in an alternating pattern. Similarly, each column contains two first doped regions of the plurality of first doped regions C1, C2, . . . C8 and two second doped regions of the plurality of second doped regions E1, E2, . . . E8. Within each column, the first doped regions C1, C2, . . . C8 and the second doped regions E1, E2, . . . E8 of the respective column are arranged in an alternating pattern.

In one embodiment, the plurality of transistors 202_1, 202_2, . . . 202_8, as illustrated and described in connection with FIG. 2, may be BJTs. In one example, the plurality of BJTs 202_1, 202_2, . . . 202_8 may be npn-transistors. The plurality of first doped regions C1, C2, . . . C8 may form collector regions of the plurality of BJTs 202_1, 202_2, . . . 202_8 and the plurality of second doped regions E1, E2, . . . E8 may form emitter regions of the plurality of BJTs 202_1, 202_2, . . . 202_8. The third doped region B may form a common base region of the plurality of BJTs 202_1, 202_2, . . . 202_8. The plurality of collector regions C1, C2, . . . C8 may be electrically interconnected to each other to form a common collector terminal and the plurality of emitter regions E1, E2, . . . E8 may be electrically interconnected to each other to form a common emitter terminal. The plurality of BJTs 202_1, 202_2, . . . 202_8 of the ESD protection structure 200 may be coupled in parallel, similar to the ESD protection structure 100 as illustrated and described in connection with FIG. 1.

The plurality of collector regions C1, C2, . . . C8 and the plurality of emitter regions E1, E2, . . . E8 may be arranged in an array of rows and columns. The plurality of collector regions C1, C2, . . . C8 and the plurality of emitter regions E1, E2, . . . E8 may be arranged in an alternating pattern within each row of the array and the plurality of collector regions C1, C2, . . . C8 and the plurality of emitter regions E1, E2, . . . E8 may be arranged in an alternating pattern within each column of the array. The common base region may surround the plurality of collector regions C1, C2, . . . C8 and the plurality of emitter regions E1, E2, . . . E8 and the common base region may form a common base terminal of the plurality of BJTs 202_1, 202_2, . . . 202_8.

Each collector region C1, C2, . . . C8 of the plurality of BJTs 202_1, 202_2, . . . 202_8 may be placed adjacent to an emitter region belonging to the same BJT and may be placed adjacent to at least one further emitter region of a further BJT of the plurality of BJTs 202_1, 202_2, . . . 202_8.

The common base region may comprise a plurality of base contacts 212 and the common base region may be restricted to be contacted via the plurality of base contacts 212.

The plurality of collector regions C1, C2, . . . C8 may be electrically interconnected to each other to form a common collector terminal and the plurality of emitter regions E1, E2, . . . E8 may be electrically interconnected to each other to form a common emitter terminal. In one embodiment, the ESD protection structure 200 may include a transfer structure and the transfer structure may be coupled between the common base terminal and one of the common collector terminal and the common emitter terminal. The transfer structure may correspond to the transfer structure 108, as illustrated and described in connection with FIG. 1.

In one embodiment, the plurality of BJTs 202_1, 202_2, . . . 202_8 are configured to dissipate an ESD event received on at least one of the common collector terminal and the common emitter terminal.

Figure 3:
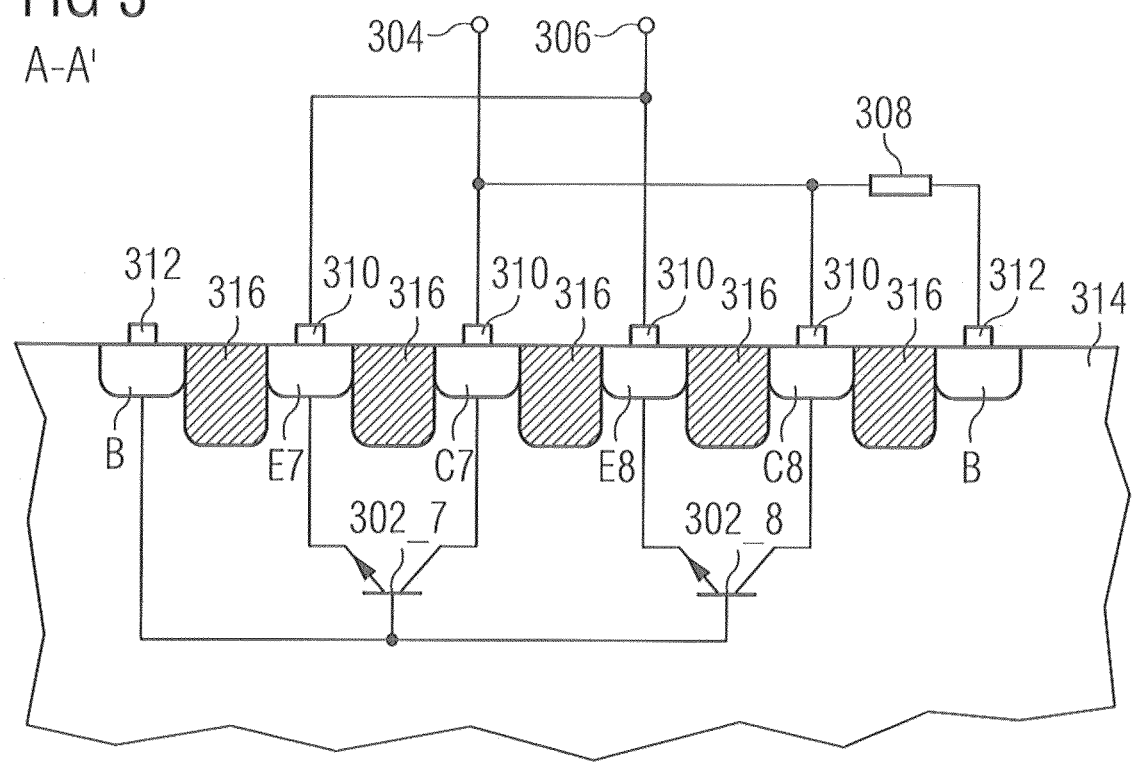
FIG. 3 shows a partial section of a cross-sectional view of the ESD protection structure taken along line A-A' of FIG. 2.

FIG. 3 shows a partial section of a cross-sectional view of the ESD protection structure 200 taken along line A-A' of FIG. 2. The second doped region E7, the first doped region C7, the second doped region E8, the first doped region C8 and the third doped region B are formed in a substrate 314.

In one embodiment, the substrate 314 may be a semiconductor well and the semiconductor well 314 may be formed in or above or over a further semiconductor substrate (not shown in FIG. 3), which may be a silicon substrate, a silicon carbon substrate, or the like. Additionally or alternatively, an n-type buried layer (NBL) or deep N-well (DNW) (also not shown in FIG. 3) may be part of the ESD protection structure 200. In one embodiment, the ESD protection structure 200 may be formed using a dual-well process. In another embodiment, the ESD protection structure 200 may be formed using a triple-well process. The ESD protection structure 200 may be formed on an EPI (epitaxy) wafer and the EPI wafer may be of a different conductivity type than a bulk material.

The second doped region E7, the first doped region C7, the second doped region E8 and the first doped region C8 may be heavily doped N+-regions and the third doped region B may be a heavily doped P+-region. In general, the second doped regions E7 and E8 and the first doped regions C7 and C8 are of a first conductivity type and the third doped region B is of a second conductivity type. The second conductivity type is opposite the first conductivity type. The substrate 314 may be a P-well. In one embodiment, a dopant concentration of the P-well 314 may be between about $10^{15}/cm^3$ and about $10^{17}/cm^3$. The dopant concentration of the heavily doped N+-regions E7, C7, E8 and C8 and the heavily doped P+-region B may be about $10^{19}/cm^3$. It is to be noted that the values recited throughout the description are examples and may be changed in different embodiments. The dopant concentration may depend on the specific device type, technology generation, minimum feature size, and the like.

As schematically illustrated in FIG. 3, the second doped region E7, the first doped region C7 and the third doped region B together form the transistor 302_7. The second doped region E8, the first doped region C8 and the third doped region B together form the transistor 302_8. The third doped region B surrounds the second doped region E7, the first doped region C7, the second doped region E8 and the first doped region C8.

The second doped region E7, the first doped region C7, the second doped region E8, the first doped region C8 and the third doped region B are spaced apart from each other by isolation regions 316. More precisely, the second doped region E7 and the first doped region C7 are spaced apart from each other by the isolation region 316. Likewise, the first doped region C7 and the second doped region E8 are spaced apart from each other by the isolation region 316, the second doped region E8 and the first doped region C8 are spaced apart from each other by the isolation region 316, and the third doped region B is spaced apart from the second doped region E7 and the first doped region C8 by isolation regions 316. The isolation regions 316 may include shallow trench isolation (STI) regions, LOCOS (LOCal Oxidation of Silicon) or substrate.

In one embodiment, during processing of the ESD protection structure 200, the plurality of first doped regions C1, C2, . . . C8 and the plurality of second doped regions E1, E2, . . . E8 may be formed simultaneously, and hence may be at a same level, have a same dopant concentration, and/or may extend down to substantially a same depth. As illustrated in FIG. 3, the first doped regions C7 and C8 and the second doped regions E7 and E8 are at a same level, have a same dopant concentration and extend down to substantially a same depth. Likewise, the other first doped regions C1, C2, . . . C6 of the plurality of first doped regions C1, C2, . . . C8 and the other second doped regions E1, E2, . . . E6 of the plurality of second doped regions E1, E2, . . . E8 of the ESD protections device 200, as illustrated and described in connection with FIG. 2, may be at a same level, have a same dopant concentration and extend down to substantially a same depth. In another embodiment, not all of the plurality of first doped regions C1, C2, . . . C8 and the plurality of second doped regions E1, E2, . . . E8 may have the same topology.

Referring to FIG. 3, contacts 310 and 312 may be placed over or above each of the third doped region B, the second doped regions E7 and E8 and the first doped regions C7 and C8. The third doped region B, the second doped regions E7 and E8 and the first doped regions C7 and C8 may be contacted through the contacts 310 and 312 for electrical connection. As illustrated in FIG. 3, the contacts 310 and 312 may be placed directly on the third doped region B, the second doped regions E7 and E8 and the first doped regions C7 and C8. In another embodiment, at least one layer may be located between the contacts 310 and 312 and the third doped region B, the second doped regions E7 and E8 and the first doped regions C7 and C8. For example, a silicide layer (not shown in FIG. 3) may be disposed between the contacts 310 and 312 and at least one of the third doped region B, the second doped regions E7 and E8 and the first doped regions C7 and C8 to improve the electrical properties of the ESD protection structure 200. For example, a silicide blocking layer may provide current limiting in case of an ESD event.

FIG. 3 further shows a schematic illustration of elements that are electrically coupled to the third doped region B, the second doped regions E7 and E8 and the first doped regions C7 and C8 via contacts 310 and 312. The first doped regions C7 and C8 are coupled to each other to form a first terminal 304 of the ESD protection structure 200. The second doped regions E7 and E8 are coupled to each other to form a second terminal 306 of the ESD protection structure 200. The third doped region B is coupled to the first terminal 304 via a transfer structure 308. The transfer structure 308 may be similar to the transfer structure 108 as illustrated and described in connection with FIG. 1. The transfer structure 308 may be used to get the P-well 314 to a high ohmic state.

Similarly to the ESD protection structure 100 as illustrated and described in connection FIG. 1, the first terminal 304 may be coupled to one of a supply voltage, a ground voltage and an I/O-signal and the second terminal 306 may be coupled to one of a supply voltage, a ground voltage and an I/O-signal. An ESD stress event may occur on at least one of the first terminal 304 and the second terminal 306. The ESD protection structure 200 may dissipate the ESD stress event received on at least one of the first terminal 304 and the second terminal 306 and may provide efficient protection from ESD damage.

FIG. 3 shows a cross-sectional view of one row of the array of the ESD protection structure 200 as illustrated and described in connection with FIG. 2. The transistor 302_7 of FIG. 3 corresponds to the transistor 202_7 of FIG. 2 and the transistor 302_8 of FIG. 3 corresponds to the transistor 202_8 of FIG. 2. The first doped regions C7 and C8 and the second doped regions E7 and E8 are arranged in an alternating pattern and are surrounded by the third doped region B. The other three rows of the array of the ESD protections device 200 as illustrated and described in connection with FIG. 2 may be formed in a similar manner as the first doped regions C7 and C8 and the second doped regions E7 and E8, as illustrated and described in connection with FIG. 3. For example, a plurality of isolation regions 316 may be arranged between each of the plurality of first doped regions C1, C2, . . . C8, each of the plurality of second doped regions E1, E2, . . . E8 and the third doped region B.

Generally, the ESD protection structure 200 may include the substrate 314 and the plurality of first doped regions C1, C2, . . . C8 may form first terminals of the plurality of transistors 202_1, 202_2, . . . 202_8. The plurality of first doped regions C1, C2, . . . C8 may be formed in the substrate 314. The plurality of second doped regions E1, E2, . . . E8 may form second terminals of the plurality of transistors 202_1, 202_2, . . . 202_8. The plurality of second doped regions E1, E2, . . . E8 may be formed in the substrate. The first doped regions C1, C2, . . . C8 of the plurality of transistors 202_1, 202_2, . . . 202_8 and the second doped regions E1, E2, . . . E8 of the plurality of transistors 202_1, 202_2, . . . 202_8 may be arranged in an alternating pattern. Each first doped region C1, C2, . . . C8 of the plurality of transistors 202_1, 202_2, . . . 202_8 may face a second doped region E1, E2, . . . E8 belonging to the same transistor and may further face at least one further second doped region E1, E2, . . . E8 of a further transistor of the plurality of transistors 202_1, 202_2, . . . 202_8. The third doped region B may surround the plurality of first doped regions C1, C2, . . . C8 and the plurality of second doped regions E1, E2, . . . E8 to form a common third terminal of the plurality of transistors 202_1, 202_2, . . . 202_8. The third doped region B may be formed in the substrate 314. The ESD protection structure 200 may also be referred to as integrated circuit or semiconductor device.

As illustrated in connection with FIGS. 2 and 3, the plurality of first doped regions C1, C2, . . . C8 and the plurality of second doped regions E1, E2, . . . E8 may have a square shape. In other embodiments, the shape of the plurality of first doped regions C1, C2, . . . C8 and the plurality of second doped regions E1, E2, . . . E8 may be different. For example, the plurality of first doped regions C1, C2, . . . C8 and the plurality of second doped regions E1, E2, . . . E8 may have a rectangular, an octagon, a hexagon, a polygon, a round or an ellipse shape.

As illustrated and described in connection with FIGS. 2 and 3, the plurality of first doped regions E1, E2, . . . E8 and the plurality of second doped regions C1, C2, . . . C8 may be arranged in an alternating pattern. In the 4×4 array as illustrated and described in connection with FIGS. 2 and 3, each first doped region of the plurality of first doped regions C1, C2, . . . C8 is placed next to a second doped region that belongs to the same transistor as the first doped region. Furthermore, each first doped region of the plurality of first doped regions C1, C2, . . . C8 is placed adjacent to at least one further second doped region of the plurality of second doped regions E1, E2, . . . E8. This further second doped region belongs to a further transistor. That means, an ESD current received on any first doped region of the plurality of first doped regions C1, C2, . . . C8 may divide and dissipates through at least two second doped regions of the plurality of second doped regions E1, E2, . . . E8.

In the embodiments as illustrated and described in connection with FIGS. 2 and 3, within each row and within each column of the ESD protection structure 200, the sequence of the placement of the plurality of first doped regions C1, C2, . . . C8 and the plurality of second doped regions E1, E2, . . . E8 is either: first doped region—second doped region—first doped region—second doped region, or: second doped region—first doped region—second doped region—first doped region. That means, each first doped region is just neighboring second doped regions and each second doped region is just neighboring first doped regions. In other embodiments, the alternating arrangement of the plurality of first doped regions C1, C2, . . . C8 and the plurality of second doped regions E1, E2, . . . E8 may be different. For example, the ESD protection structure 200 may include at least one first doped region of the plurality of first doped regions C1, C2, . . . C8 that is neighboring a further first doped region of the plurality of first doped regions C1, C2, . . . C8. Additionally or alternatively, at least one second doped region of the plurality of second doped regions E1, E2, . . . E8 may be neighboring a further second doped region of the plurality of second doped regions E1, E2, . . . E8.

As illustrated and described in connection with FIGS. 2 and 3, just one contact 210 and 310 may be disposed on or above or over each of the plurality of first doped regions C1, C2, . . . C8 and the plurality of second doped regions E1, E2, . . . E8. In other embodiments, a plurality of contacts may be placed on or above or over each of the plurality of first doped regions C1, C2, . . . C8 and the plurality of second doped regions E1, E2, . . . E8 to improve the electrical connection.

In the embodiments as illustrated and described in connection with FIGS. 1-3, the ESD protection structure 100 and 200 may include a plurality of BJTs of npn-type. In other embodiments, the ESD protection structure 100 and 200 may include other types of transistors. For example, the ESD protection structure 100 and 200 may include a plurality of BJTs of pnp-type or a plurality of CMOS transistors.

Figure 4:
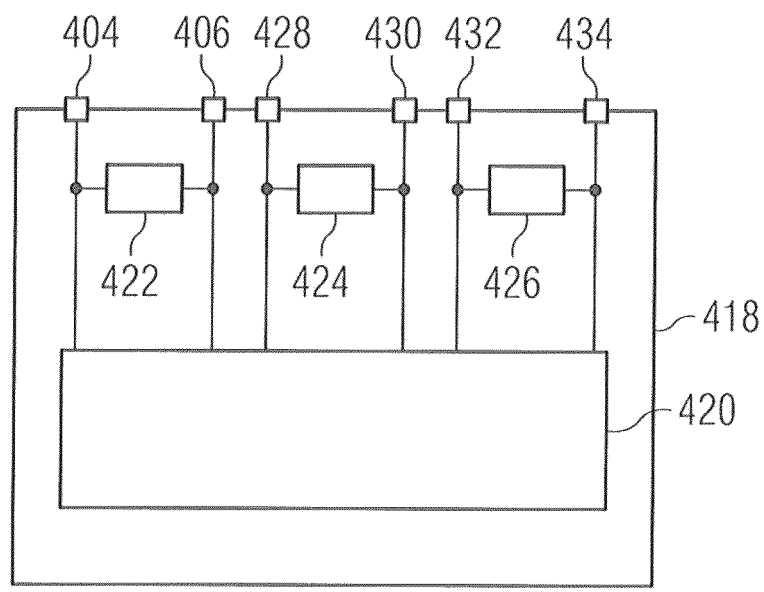
FIG. 4 shows a schematic circuit diagram of an exemplary integrated circuit that includes a plurality of ESD protection structures and a semiconductor circuit.

FIG. 4 shows a schematic circuit diagram of an exemplary integrated circuit 418. The integrated circuit 418 includes a plurality of ESD protection circuits 422, 424 and 426 and a semiconductor circuit 420. Each of the plurality of ESD protection circuits 422, 424 and 426 may include any of the ESD protection structures described herein, including one of the ESD protection structures 100 and 200, as illustrated and described in connection with FIGS. 1-3. The plurality of ESD protection circuits 422, 424 and 426 and the semiconductor circuit 420 are coupled to terminals 404, 406, 428, 430, 432 and 434 of the integrated circuit 418. The terminals 404, 406, 428, 430, 432 and 434 may be external terminals of the integrated circuit 418 and the semiconductor circuit 420 may be coupled to external circuits via the external terminals 404, 406, 428, 430, 432 and 434. The external terminals 404, 406, 428, 430, 432 and 434 may be supply pins that supply voltage to the semiconductor circuit 420 and/or I/O pins that transfer input or output signals to or from the semiconductor circuit 420. The plurality of ESD protection circuits 422, 424 and 426 are coupled between the external pins 404, 406, 428, 430, 432 and 434 and the semiconductor circuit 420 to mitigate damage due to ESD pulses received at the external pins 404, 406, 428, 430, 432 and 434.

In the embodiment, as illustrated and described in connection with FIG. 4, the terminals 404, 406, 428, 430, 432 and 434 are external pins. In another embodiment, the terminals 404, 406, 428, 430, 432 and 434 may be internal nodes within an integrated circuit or nodes between discrete devices that are not implemented on an integrated circuit.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims. It is within the scope of this disclosure to combine various features of the different implementations and claims to produce variations thereof.

What is claimed is:

1. An ESD protection structure, comprising:
    a plurality of first doped regions of a first conductivity type forming first terminals of a plurality of transistors, wherein the plurality of first doped regions are formed in a substrate,
    a plurality of second doped regions of the first conductivity type forming second terminals of the plurality of transistors, wherein the plurality of second doped regions are formed in the substrate,
    wherein each of the plurality of first doped regions is arranged adjacent to one of the plurality of second doped regions in an alternating pattern in a first dimension, and each of the plurality of first doped regions is further arranged adjacent to another one of the plurality of second doped regions in an alternating pattern in a second dimension different than the first dimension, and
    a third doped region of a second conductivity type opposite the first conductivity type formed in the substrate and surrounding a plurality of doped regions to form a common third terminal of the plurality of transistors, wherein all doped regions surrounded by the third doped region are the plurality of first doped regions and the plurality of second doped regions,
    wherein the plurality of first doped regions are coupled to each other to form a first terminal of the ESD protection structure, and
    wherein the plurality of second doped regions are coupled to each other to form a second terminal of the ESD protection structure.

2. The ESD protection structure of claim 1, wherein the ESD protection structure is configured to dissipate an ESD event received on at least one of the first terminal of the ESD protection structure and the second terminal of the ESD protection structure.

3. The ESD protection structure of claim 1, further comprising a transfer structure, wherein the transfer structure is coupled between the common third terminal of the plurality of transistors and one of the first terminal of the ESD protection structure and the second terminal of the ESD protection structure.

4. The ESD protection structure of claim 1, wherein the plurality of transistors are a plurality of bipolar junction transistors (BJTs),
    wherein the plurality of first doped regions are a plurality of collector regions,
    wherein the plurality of second doped regions are a plurality of emitter regions, and
    wherein the third doped region is a base region.

5. The ESD protection structure of claim 4, wherein the plurality of BJTs are coupled in parallel.

6. The ESD protection structure of claim 1, further comprising a plurality of contacts comprised within the third doped region, wherein the third doped region is restricted to be contacted via the plurality of contacts.

7. The ESD protection structure of claim 1, wherein the first dimension comprises a first direction traversing a surface of the substrate, and
    wherein the second dimension comprises a second direction different than the first direction traversing the surface of the substrate.

8. The ESD protection structure of claim 1, further comprising a plurality of isolation regions arranged between each of the plurality of first doped regions, each of the plurality of second doped regions and the third doped region.

9. The ESD protection structure of claim 1, wherein the substrate is a semiconductor well.

10. An integrated circuit, comprising:
    an array of individual regions, the array comprising rows and columns each comprising a series of the individual regions that alternate between a collector region and an emitter region;
    a plurality of bipolar junction transistors (BJTs), each BJT comprising:
        one of the collector regions from the array of individual regions and an adjacent one of the emitter regions from the array of individual regions; and
    a common base region, wherein the common base region surrounds the array of individual regions and wherein the common base region forms a base terminal common with each of the plurality of BJTs,
    wherein the plurality of collector regions are electrically interconnected to each other to form a common collector terminal and wherein each collector region surrounded by the common base region is one of the plurality of collector regions, and
    wherein the plurality of emitter regions are electrically interconnected to each other to form a common emitter terminal and wherein each emitter region surrounded by the common base region is one of the plurality of emitter regions.

11. The integrated circuit of claim 10, wherein each collector region of the plurality of BJTs is placed adjacent to an emitter region belonging to the same BJT and is placed adjacent to at least one further emitter region of a further BJT of the plurality of BJTs.

12. The integrated circuit of claim 10, further comprising a plurality of base contacts comprised within the common base region, wherein the common base region is restricted to be contacted via the plurality of base contacts.

13. The integrated circuit of claim 10, further comprising a transfer structure, wherein the transfer structure is coupled between the common base terminal and one of the common collector terminal and the common emitter terminal.

14. The integrated circuit of claim 10, wherein the plurality of BJTs are configured to dissipate an ESD event received on at least one of the common collector terminal and the common emitter terminal.

15. The integrated circuit of claim 10, wherein the plurality of collector regions and the plurality of emitter regions are of a first conductivity type, and
wherein the common base region is of a second conductivity type opposite the first conductivity type.

16. The integrated circuit of claim 10, further comprising a plurality of isolation regions arranged between each of the plurality of collector regions, each of the plurality of emitter regions and the common base region.

17. A semiconductor device, comprising:
a plurality of first doped regions forming first terminals of a plurality of transistors,
a plurality of second doped regions forming second terminals of the plurality of transistors, and
a third doped region surrounding a plurality of doped regions to form a common third terminal of the plurality of parallel transistors, wherein each first doped region and each second doped region surrounded by the third doped region is respectively one of the plurality of first doped regions and one of the plurality of second doped regions,
wherein each of the plurality of first doped regions is arranged adjacent to one of the plurality of second doped regions in an alternating pattern in a first dimension, and each of the plurality of the first doped regions is further arranged adjacent to another one of the plurality of second doped regions in an alternating pattern in a second dimension different from the first dimension, such that an ESD discharge current received on any one of the plurality of first doped regions dissipates through at least two of the plurality of second doped regions,
wherein the plurality of first doped regions are coupled to each other to form a common first terminal, and
wherein the plurality of second doped regions are coupled to each other to form a common second terminal.

18. The semiconductor device of claim 17, wherein the plurality of first doped regions are coupled to each other to form a common first terminal, and
wherein the plurality of second doped regions are coupled to each other to form a common second terminal.

19. The semiconductor device of claim 18, further comprising a transfer structure, wherein the transfer structure is coupled between the common third terminal and one of the common first terminal and the common second terminal.

20. The semiconductor device of claim 17, wherein the plurality of transistors are a plurality of bipolar junction transistors (BJTs),
wherein the plurality of first doped regions are a plurality of collector regions,
wherein the plurality of second doped regions are a plurality of emitter regions, and
wherein the third doped region is a base region.

21. The semiconductor device of claim 20, wherein the plurality of BJTs are coupled in parallel.

22. The semiconductor device of claim 17, further comprising a plurality of contacts comprised within the third doped region, wherein the third doped region is restricted to be contacted via the plurality of contacts.

* * * * *